(12) United States Patent
Benaissa et al.

(10) Patent No.: US 8,753,941 B1
(45) Date of Patent: Jun. 17, 2014

(54) HIGH PERFORMANCE ASYMMETRIC CASCODED TRANSISTOR

(71) Applicant: Texas Instruments Incorporated, Dallas, TX (US)

(72) Inventors: Kamel Benaissa, Garland, TX (US); Vijay K. Reddy, Plano, TX (US); Samuel Martin, Cupertino, CA (US); T Krishnaswamy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/766,437

(22) Filed: Feb. 13, 2013

(51) Int. Cl.
*H01L 21/336* (2006.01)

(52) U.S. Cl.
USPC .... 438/284; 438/231; 257/358; 257/E21.616; 257/E29.055

(58) Field of Classification Search
CPC .................. H01L 21/823892; H01L 21/76237
USPC .................. 438/231, 284; 257/358, E21.616, 257/E29.055
See application file for complete search history.

(56) References Cited

U.S. PATENT DOCUMENTS

| | | | | |
|---|---|---|---|---|
| 7,414,292 B2 * | 8/2008 | Ema et al. | ...................... | 257/369 |
| 2010/0013017 A1 * | 1/2010 | Tsutsui | .......................... | 257/368 |
| 2011/0111567 A1 * | 5/2011 | Tsutsumi et al. | ............. | 438/238 |

* cited by examiner

*Primary Examiner* — Caridad Everhart

(74) *Attorney, Agent, or Firm* — Wade J Brady, III; Frederick J. Telecky, Jr.

(57) ABSTRACT

An integrated circuit with a LV transistor and a high performance asymmetric transistor. A power amplifier integrated circuit with a core transistor and a high performance asymmetric transistor. A method of forming an integrated circuit with a core transistor and a high performance asymmetric transistor. A method of forming a power amplifier integrated circuit with an nmos core transistor and an nmos high performance asymmetric transistor, a resistor, and an inductor.

31 Claims, 16 Drawing Sheets

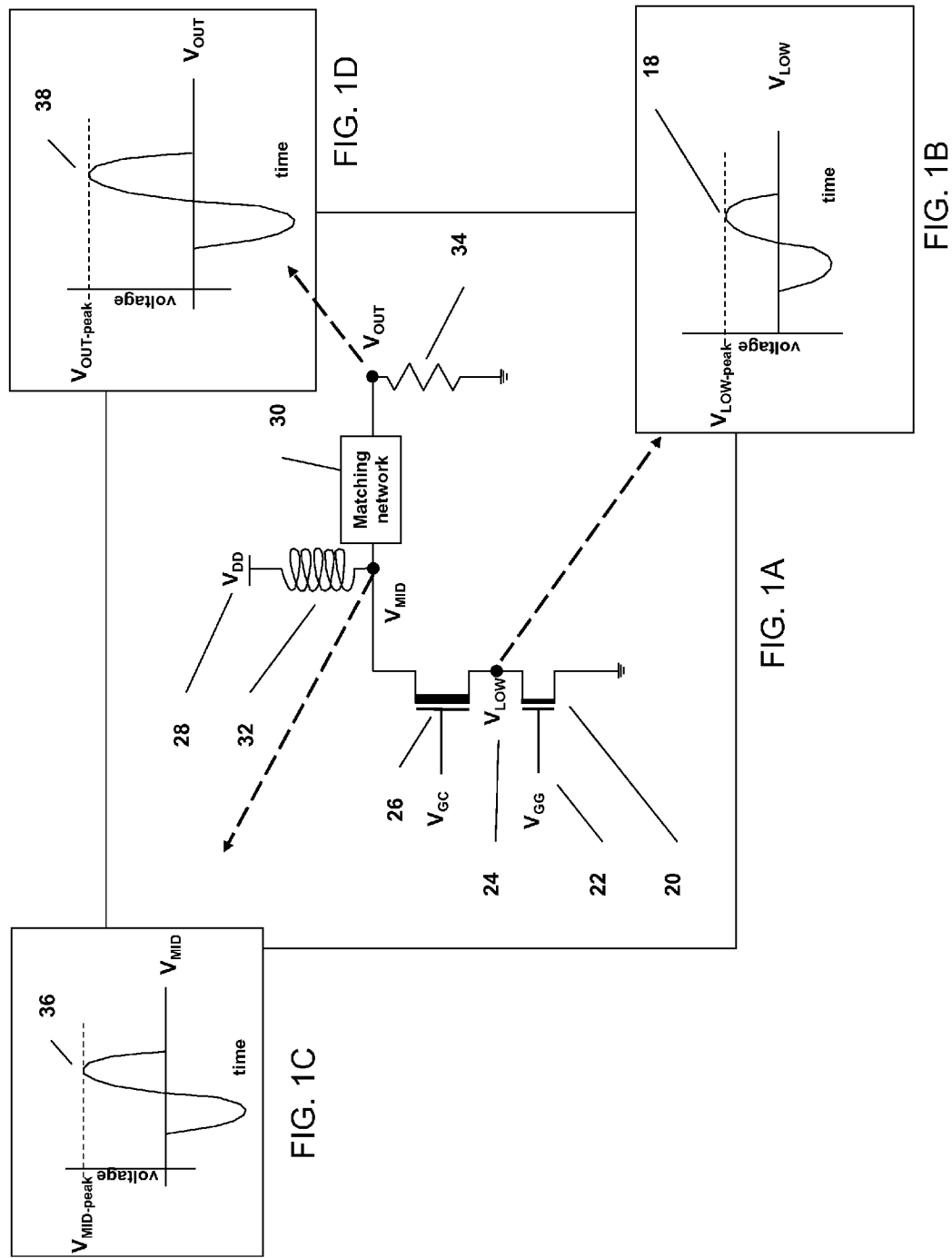

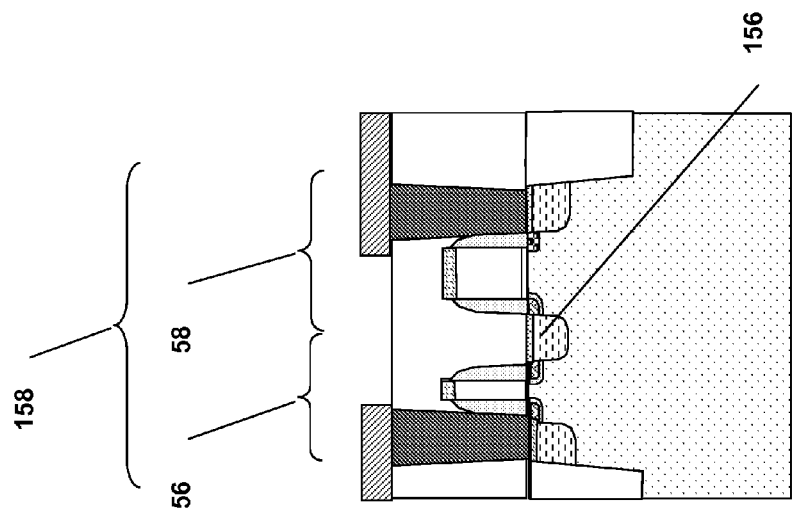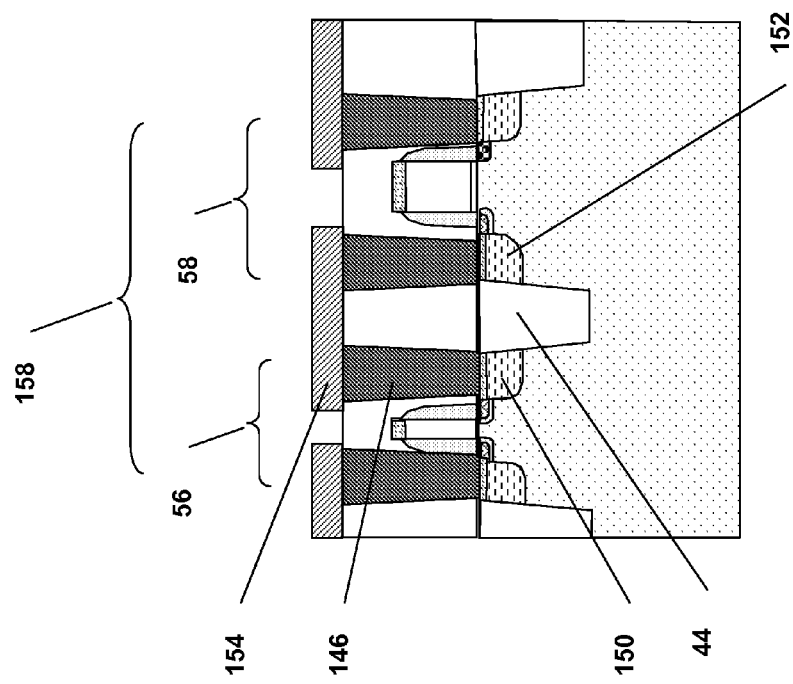

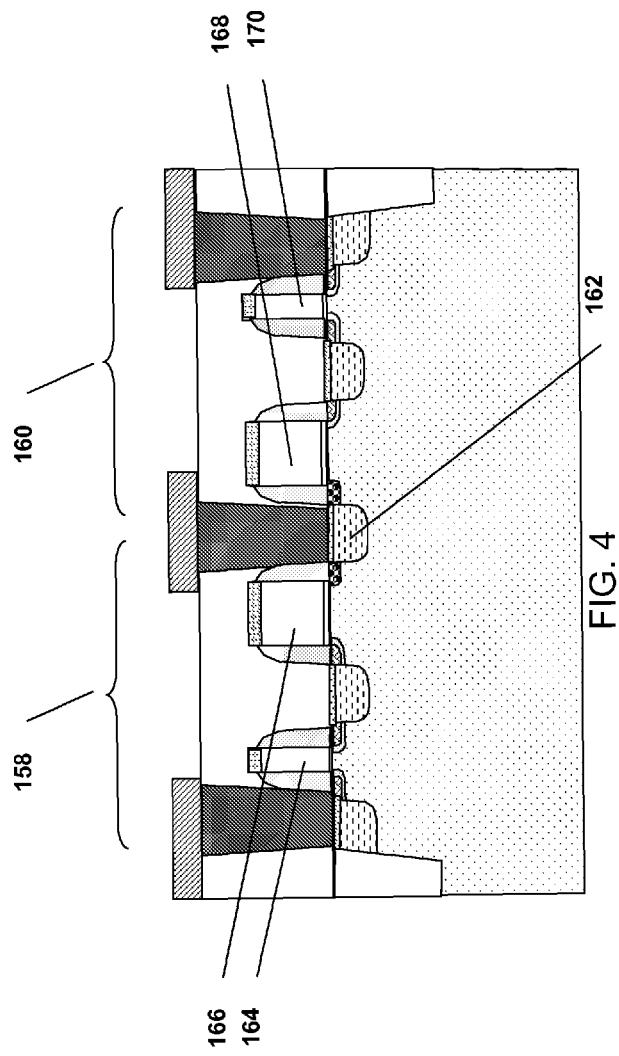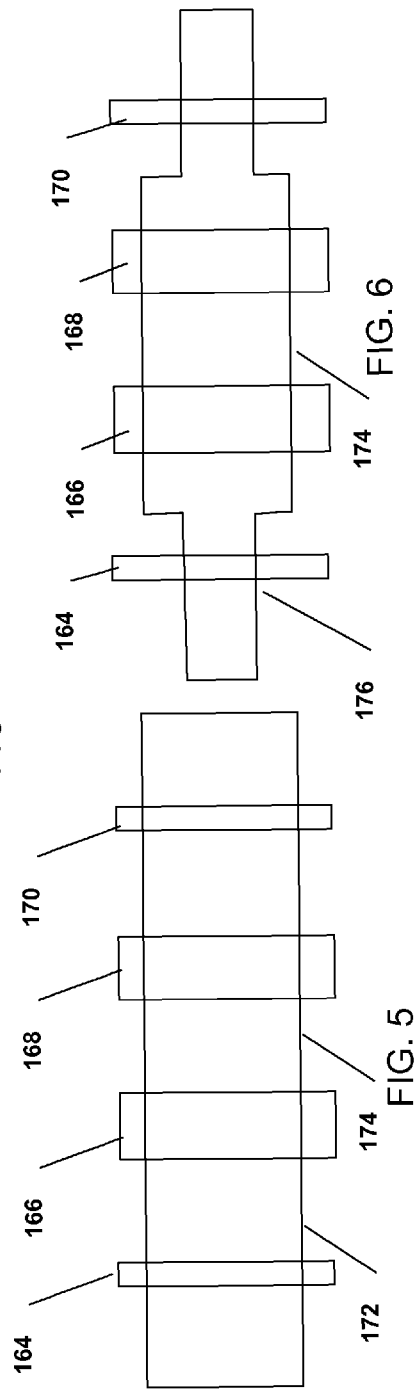

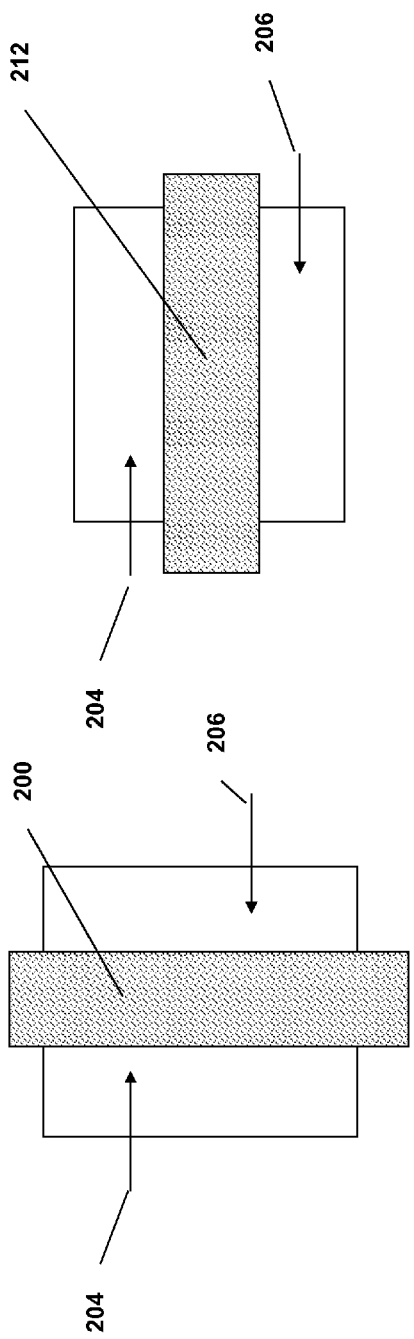
FIG. 8A
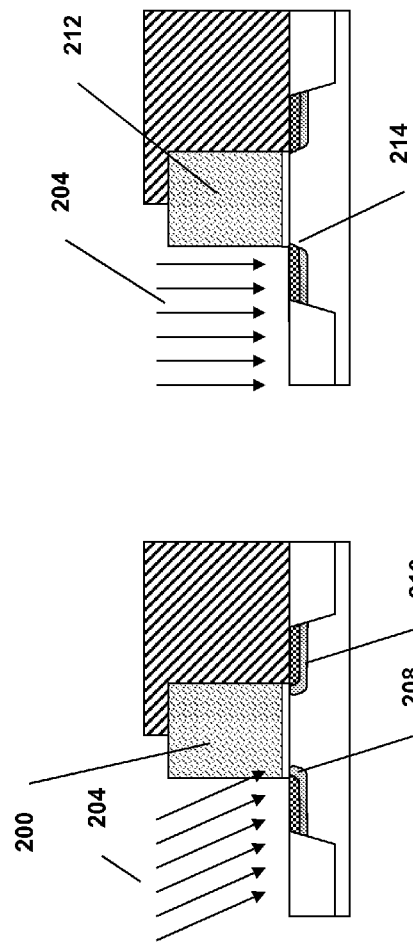
FIG. 9A
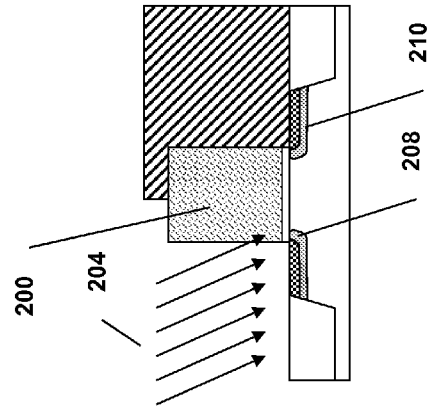
FIG. 8B
FIG. 9B

HIGH PERFORMANCE ASYMMETRIC CASCODED TRANSISTOR

This invention relates to the field of integrated circuits. More particularly, this invention relates high performance cascoded transistors in integrated circuits.

BACKGROUND

Wireless communications devices such as cellular telephones, two-way radios, personal digital assistance, wireless personal computers, laptop computers, home entertainment equipment, et cetera that communicate either directly or indirectly with other wireless communication devices. Each wireless communication device participating in wireless communications includes a built-in radio transceiver (i.e. receiver and transmitter). The transmitter of a wireless device typically includes a data modulation stage, one or more frequency conversion stages, and a power amplifier. The power amplifier amplifies the RF signals prior to transmission via an antenna. The power amplifier must operate at high frequency, provide a high swing at its output, be very linear in its operation, and use as little power as possible. These competing goals are very difficult to meet, particularly in portable devices that are battery powered and operate at relatively low voltages.

A typical RF power amplifier circuit (PA) is shown FIG. 1A. The PA circuit consists of two cascoded transistors: a low voltage (gain) transistor 20 with thin gate oxide and a high voltage (cascode) transistor 26 with thick gate oxide. An inductor 32 and output load matching network 30 circuit produces an amplified voltage swing 36 as shown in FIG. 1C. The peak mid voltage 36 at the cascode transistor 26 drain terminal may be approximately two times the power supply voltage 32. The matching network may be a transformer which may produce an even higher voltage, Vout-peak, 38 which may be 4*Vdd for example into load resistance 34 which may be an antenna. The gate dielectric on the cascode transistor 26 is sufficiently thick to withstand 2*Vdd without damage when the cascode transistor 26 is switched off. The turn on voltage of the high voltage transistor, Vthv, must be sufficiently high so that the maximum voltage, $V_{LOW\text{-}peak}$ 18, on the common diffusion 24 between the cascode transistor 26 and the gain transistor 20 in FIG. 1B does not exceed the voltage capability of the thin dielectric on the low voltage (gain) transistor 20. This voltage is equal to the voltage on the high voltage (cascode) transistor gate 26 minus the threshold voltage on the high voltage (cascode) transistor 26, Vthv. ($V_{MID\text{-}peak} \leq V_{GC} - Vthv$).

SUMMARY

An integrated circuit with a gain transistor and a high performance asymmetric cascode transistor. A power amplifier integrated circuit with a gain transistor and a high performance asymmetric cascode transistor. A method of forming an integrated circuit with a gain transistor and a high performance asymmetric cascode transistor. A method of forming a power amplifier integrated circuit with an nmos gain transistor and an nmos high performance asymmetric cascode transistor, a resistor coupled to an inductor and a matching circuit.

BRIEF DESCRIPTION OF THE DRAWINGS

FIG. 1A is a circuit diagram of a power amplifier.

FIG. 1B is a graph of the voltage versus time at the common node between the core and the high performance asymmetric transistors in the power amplifier in FIG. 1A.

FIG. 1C is a graph of the voltage versus time at the output terminal of the power amplifier in FIG. 1A.

FIG. 1D is a graph of the voltage versus time at the output terminal of the matching network in FIG. 1A.

FIG. 3A shows the transistor portion of a power amplifier according to an embodiment.

FIG. 3B shows the transistor portion of a power amplifier according to another embodiment.

FIG. 4 shows a symmetric power amplifier according to an embodiment.

FIG. 5 shows a top view of gain transistors and high performance asymmetric cascade transistors according to an embodiment.

FIG. 6 shows a top view of gain transistors and high performance asymmetric cascade transistors according to another embodiment.

FIGS. 8A and 8B show top view and cross-sectional views of a core transistor according to an embodiment.

FIGS. 9A and 9B show top view and cross-sectional views of a gain transistor according to an embodiment.

DETAILED DESCRIPTION OF EXAMPLE EMBODIMENTS

Figure 2A:
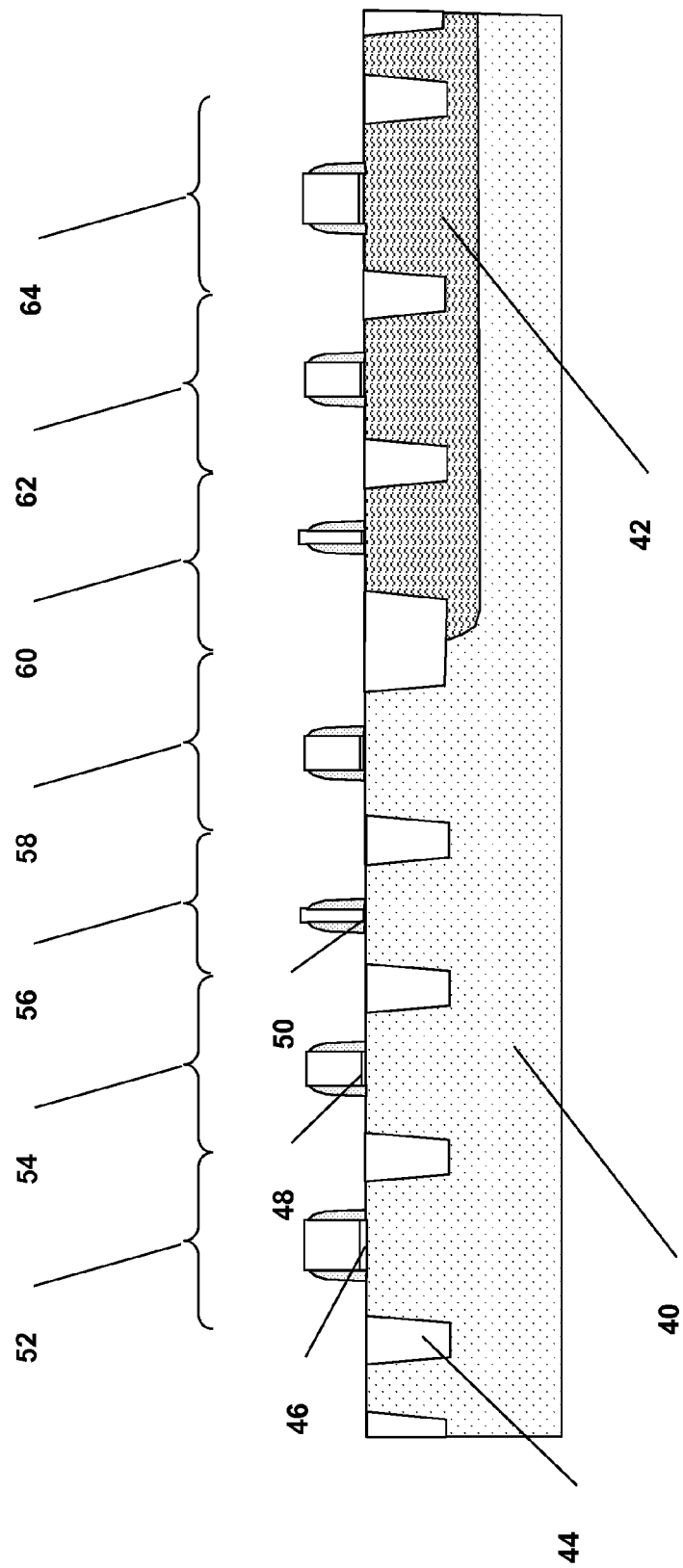
FIGS. 2A-2J are illustrations of steps in the fabrication of integrated circuits formed according to principles of the invention.
Figure 2B:
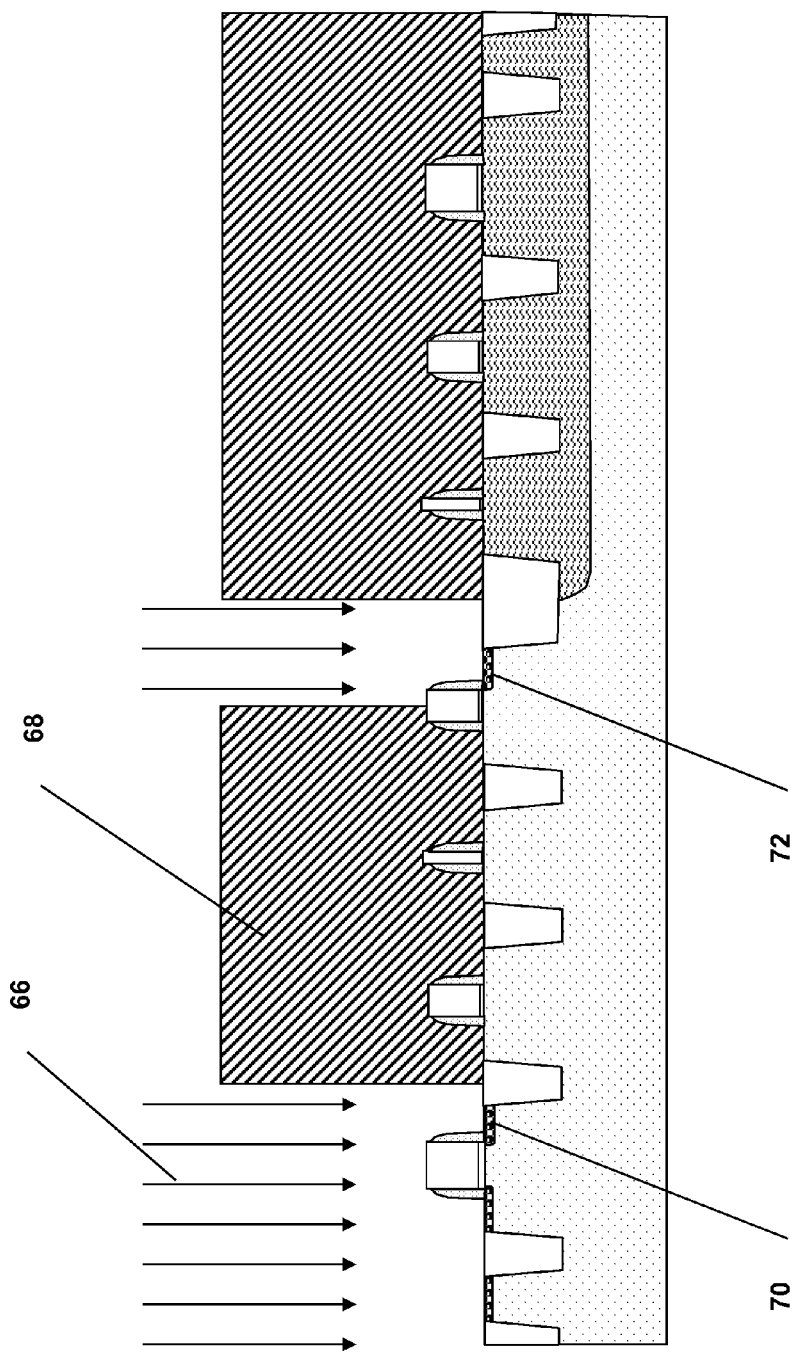
Figure 2C:
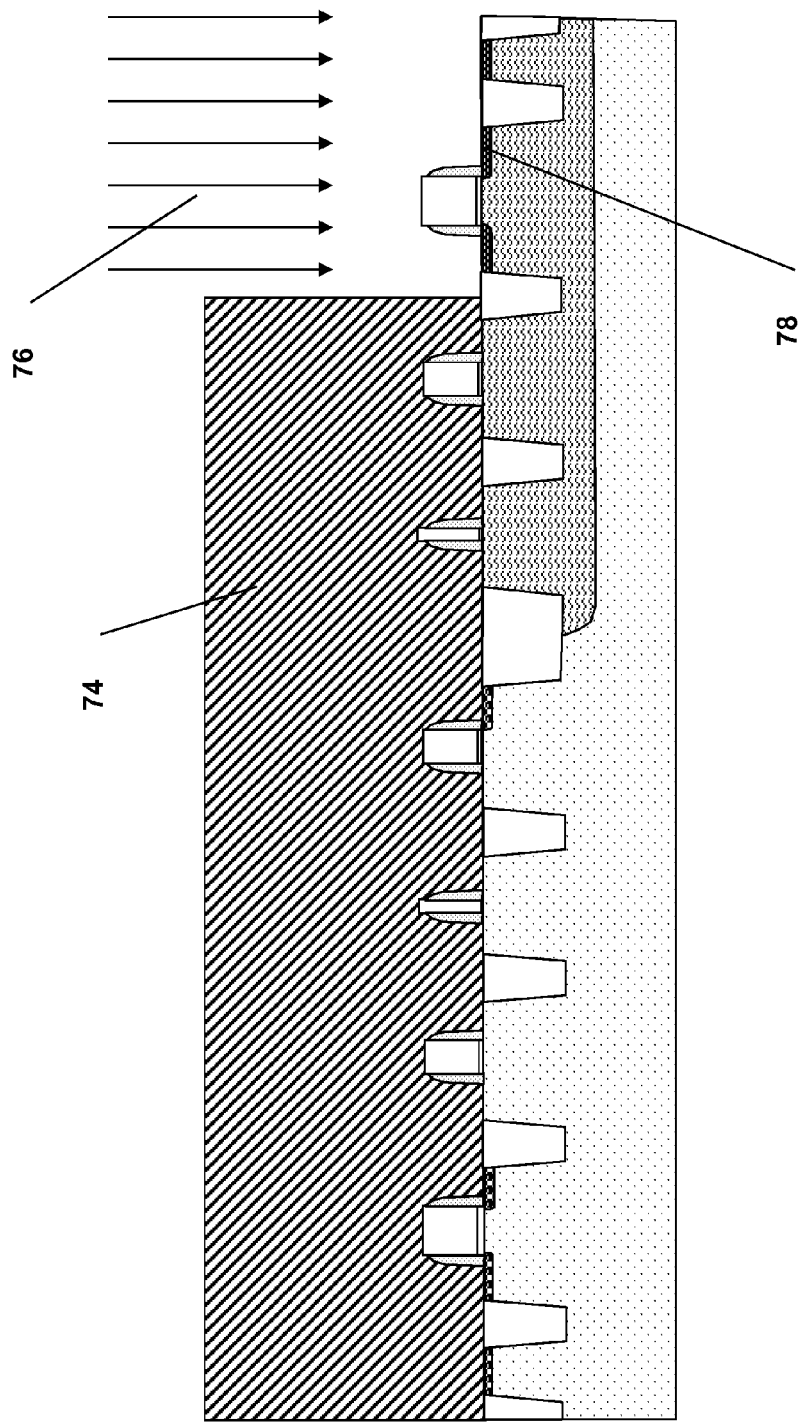
Figure 2D:
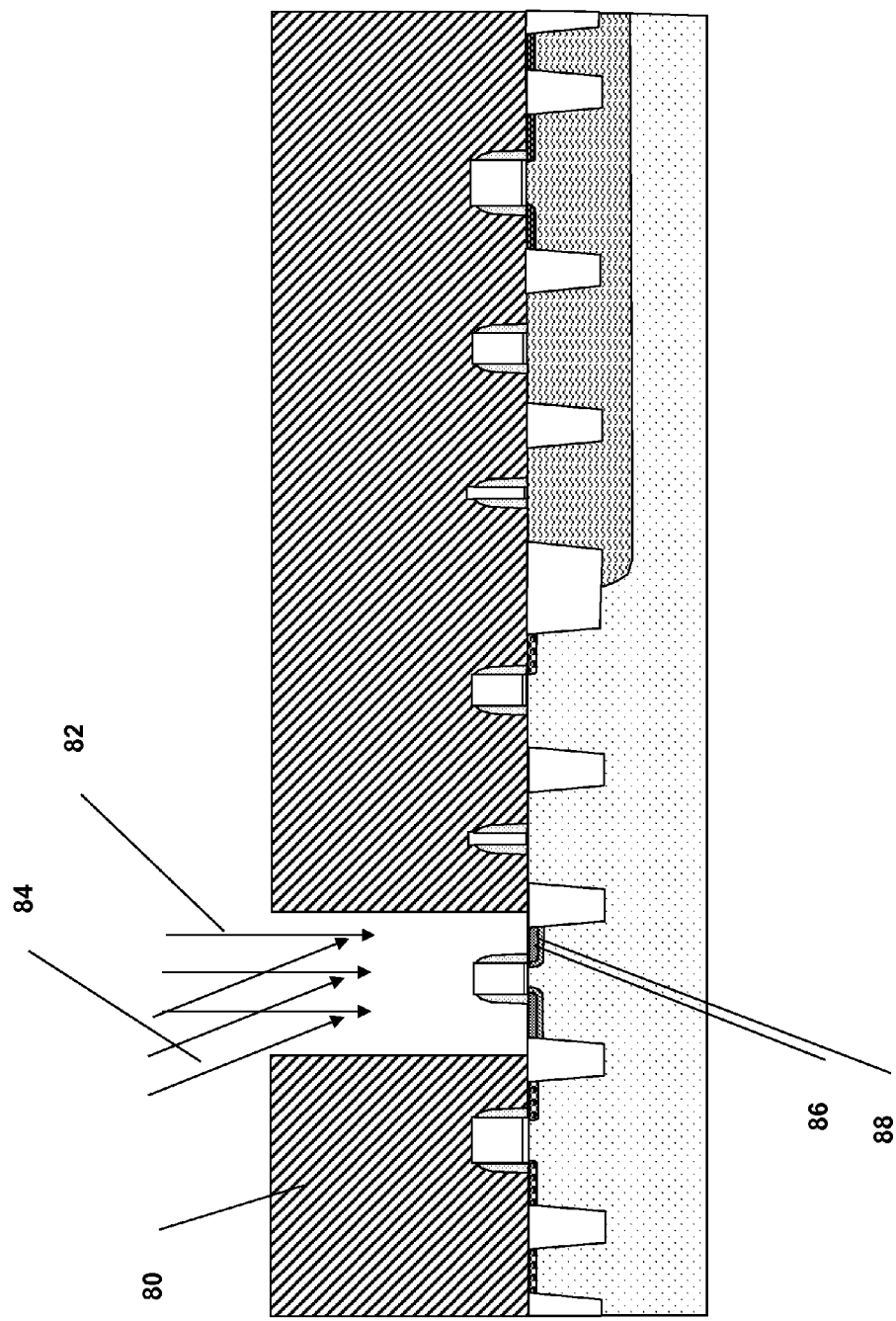
Figure 2E:
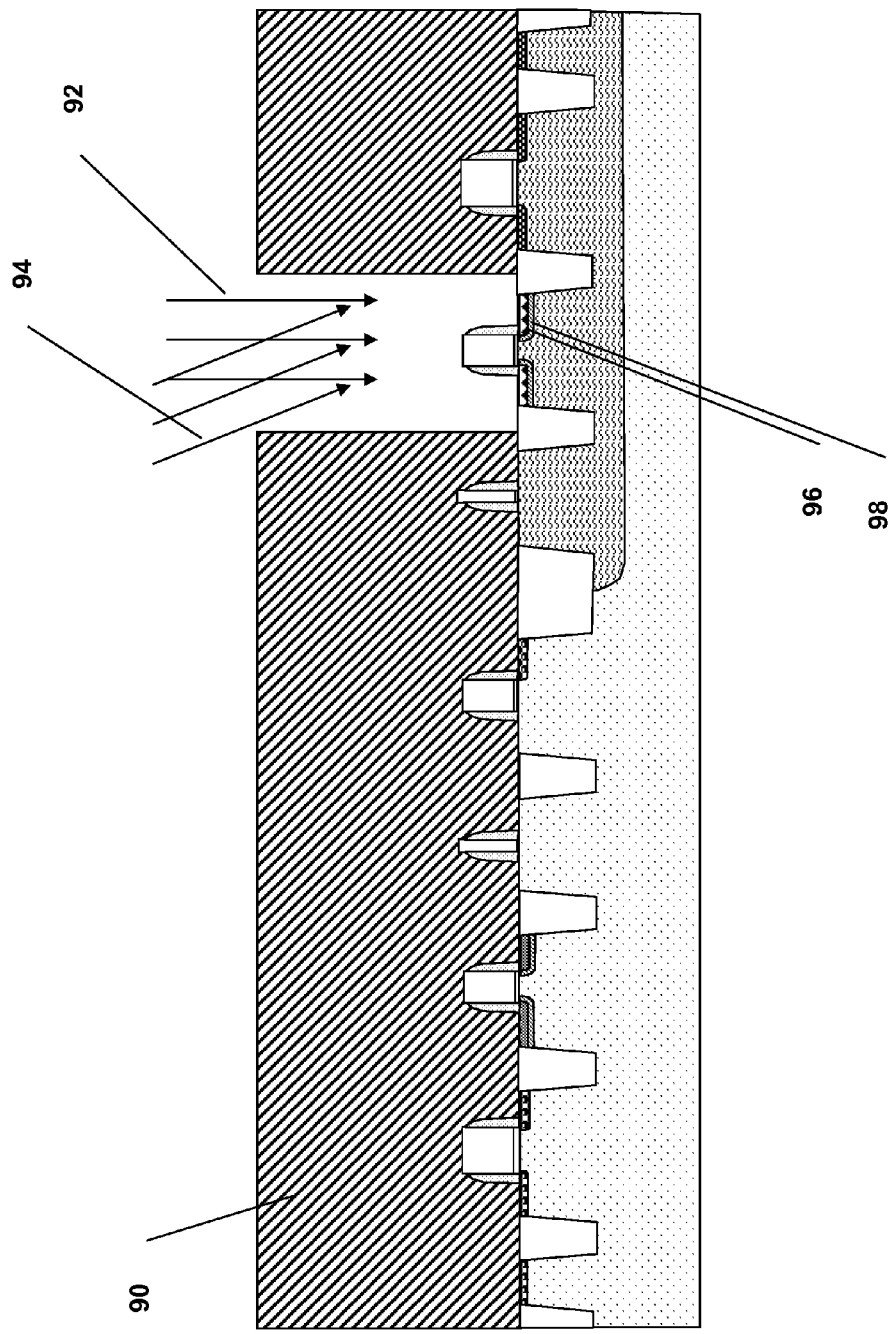
Figure 2F:
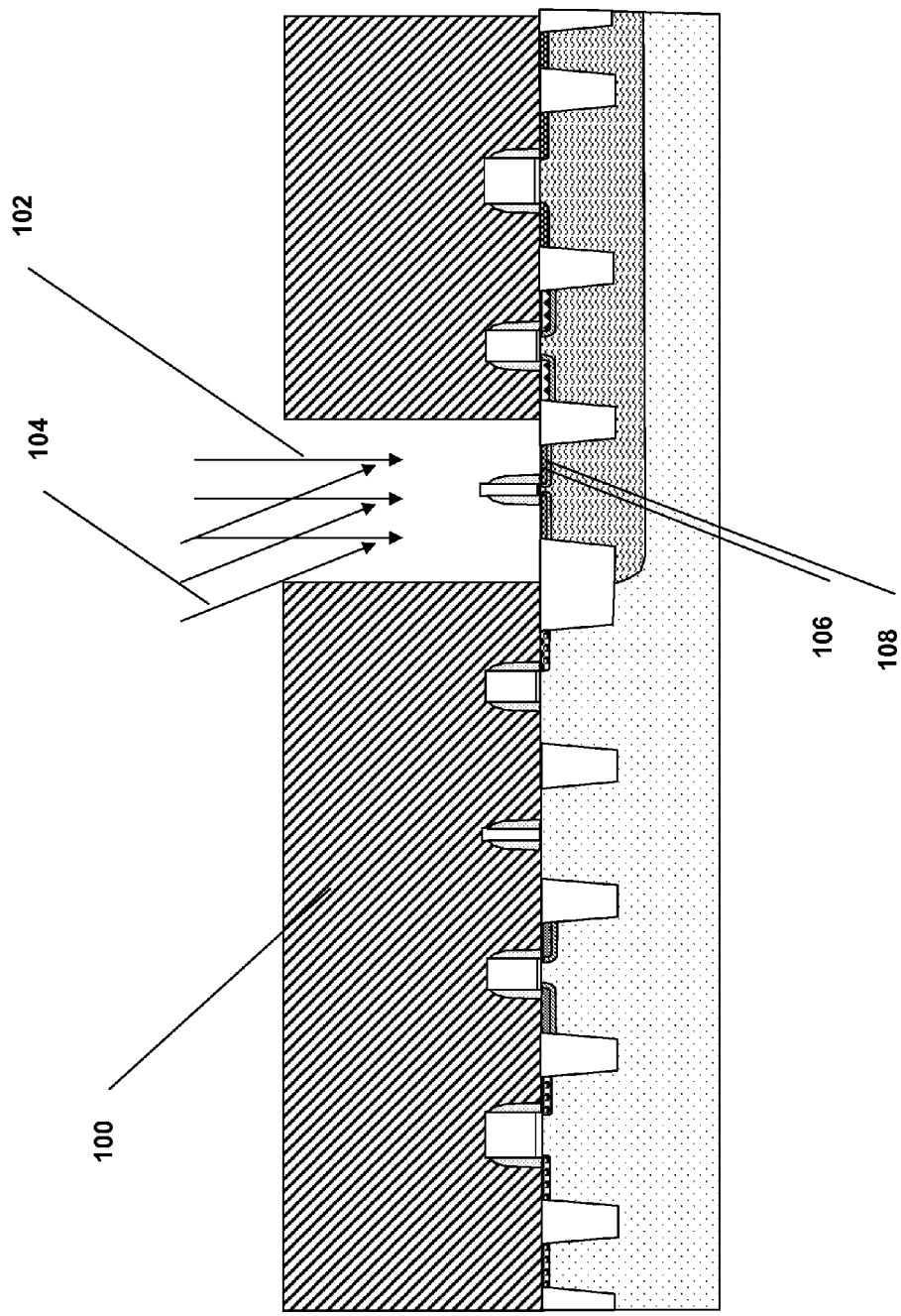
Figure 2G:
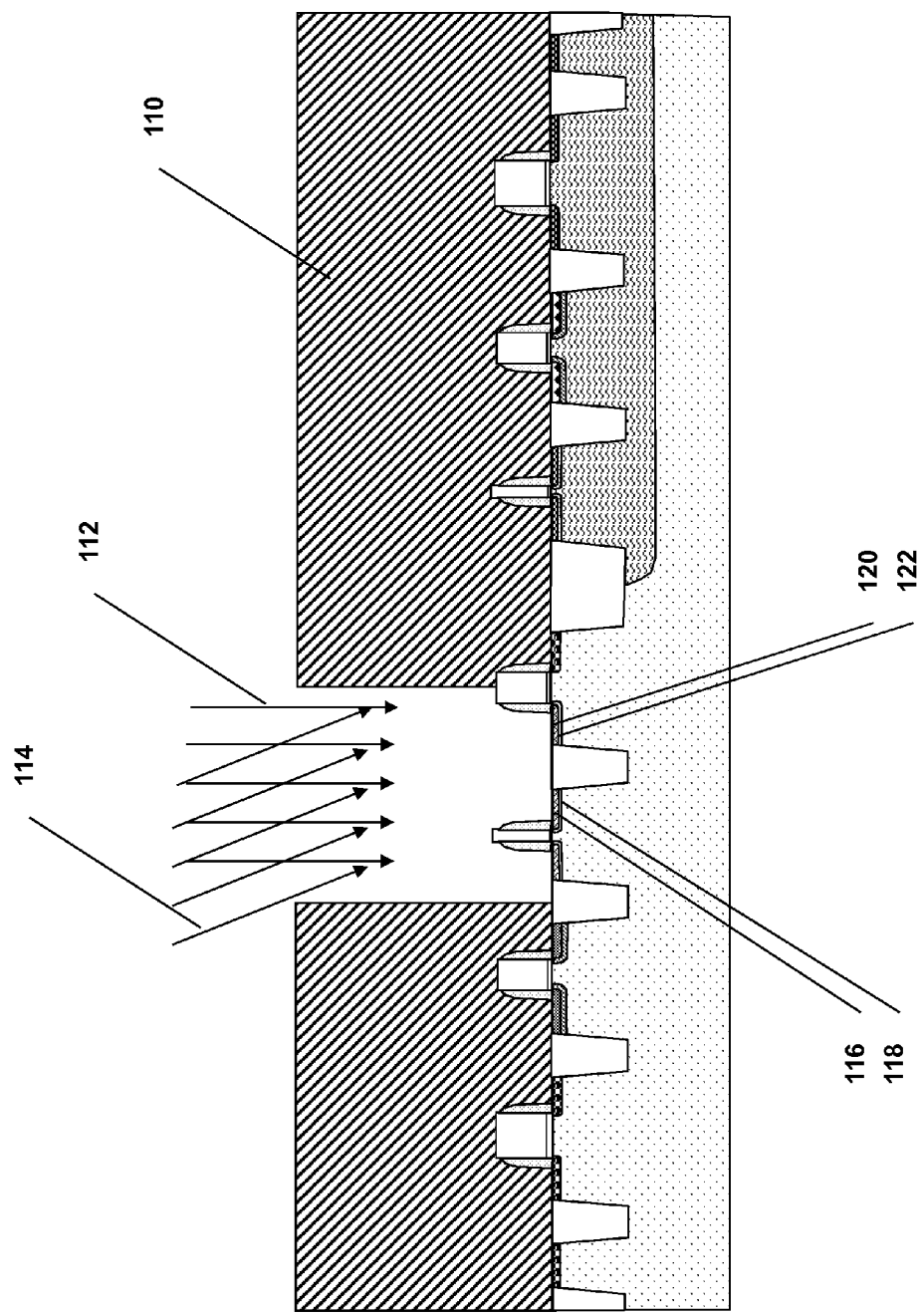
Figure 2H:
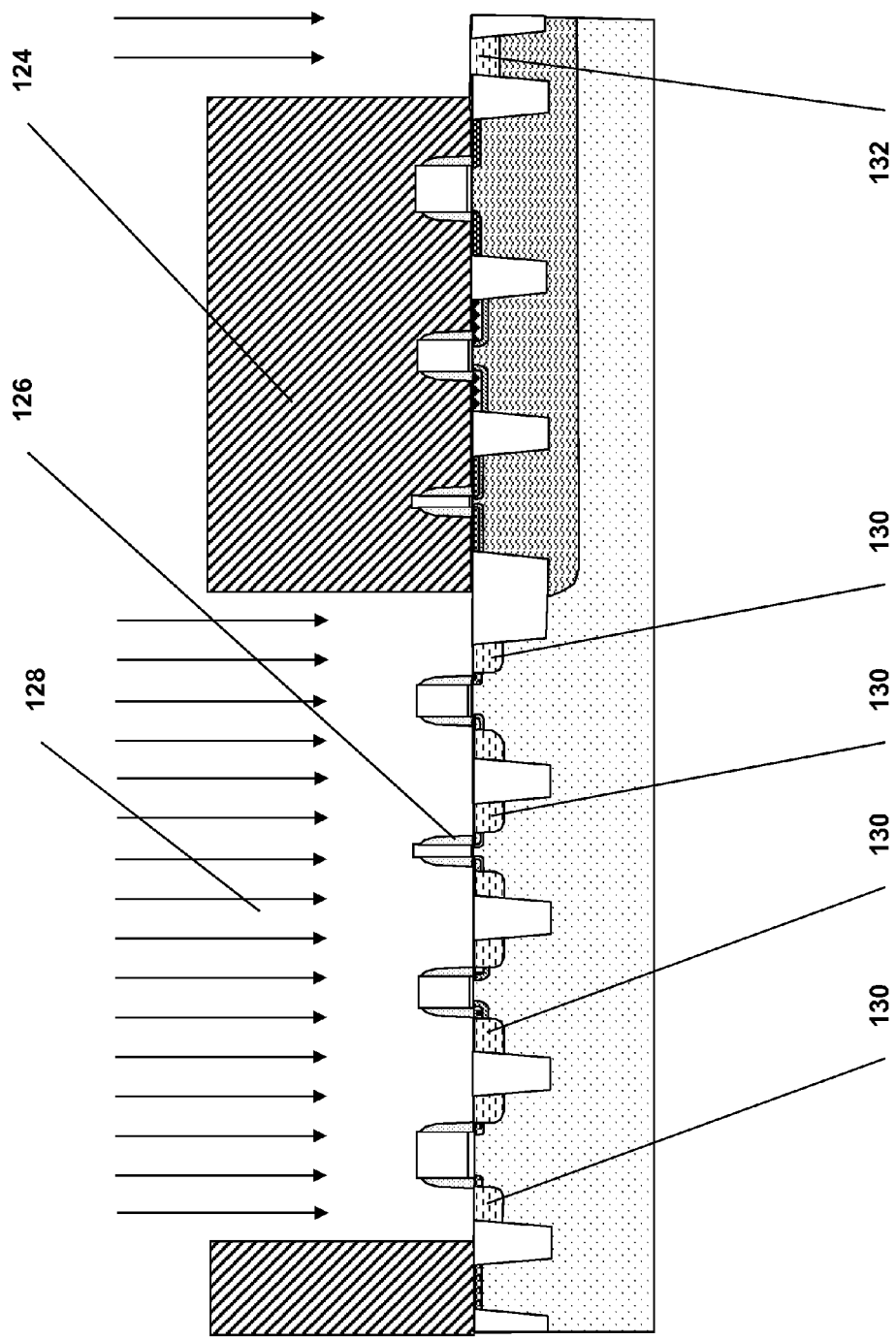
Figure 2I:
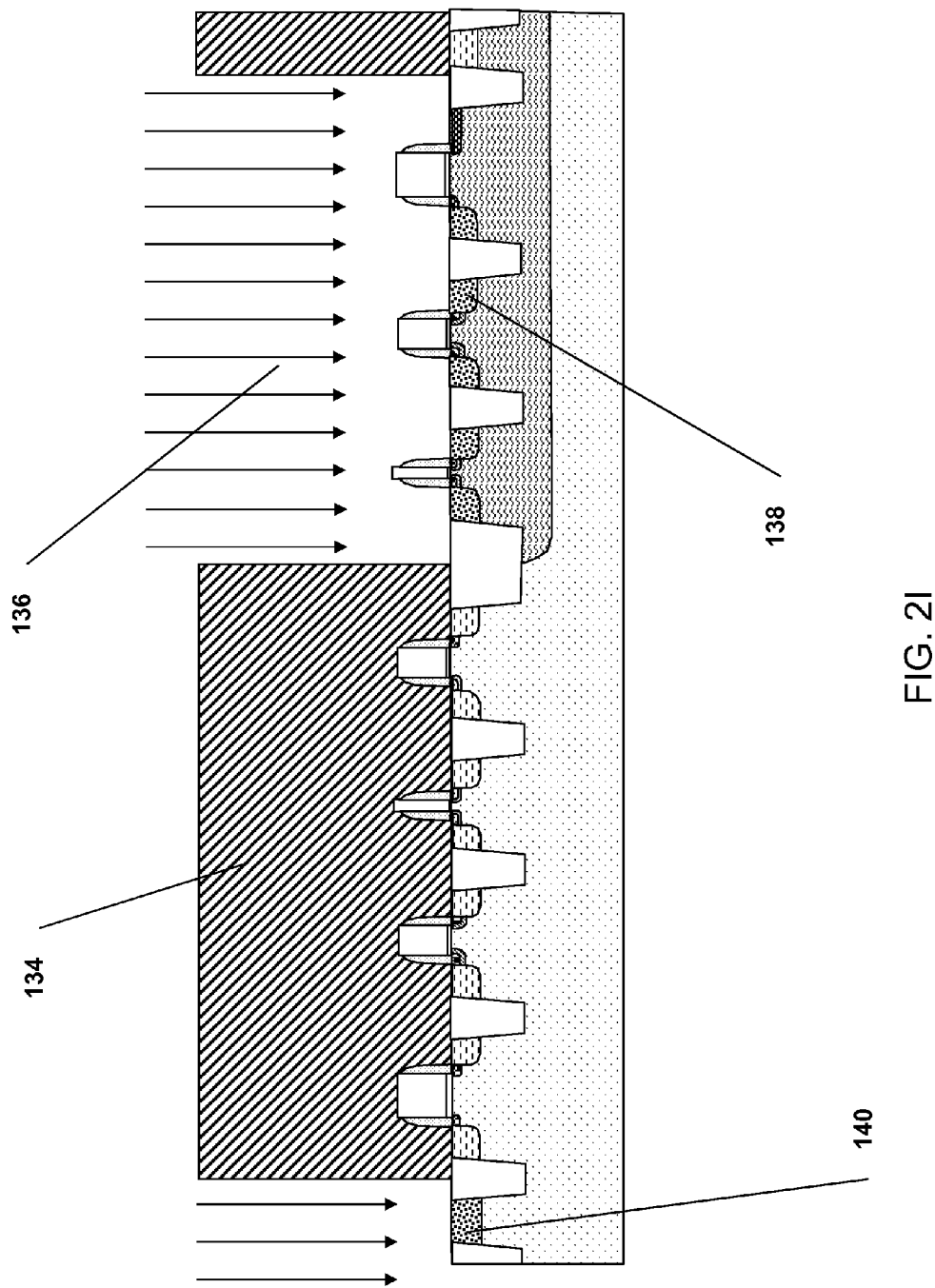
Figure 2J:
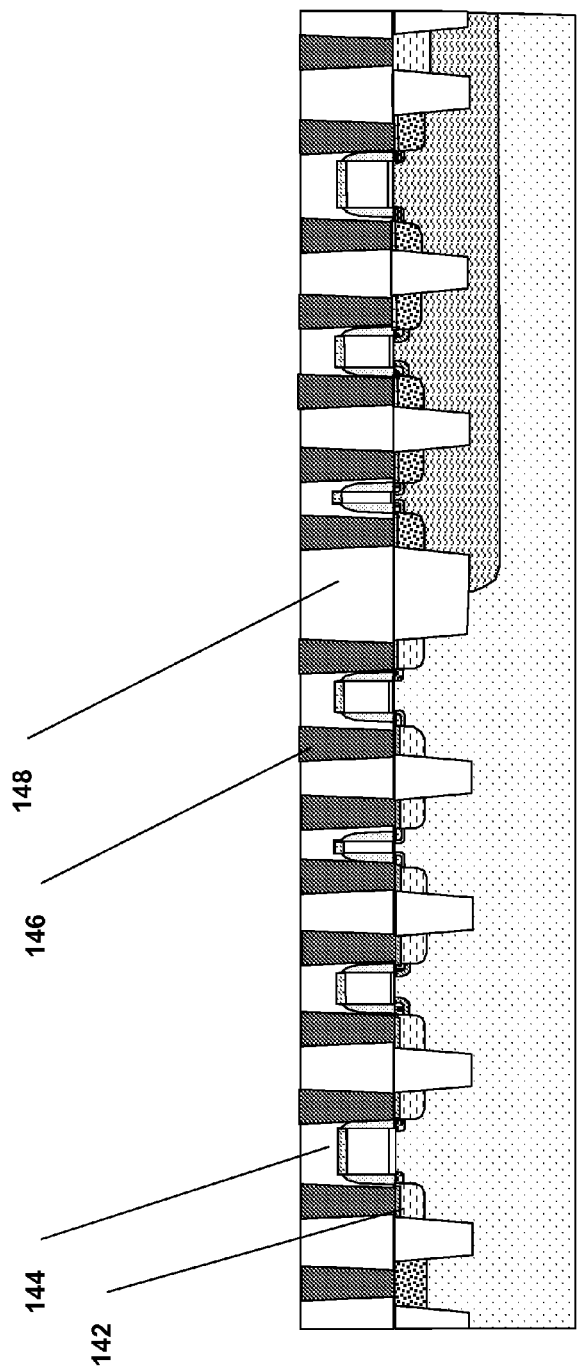
Figure 2K:
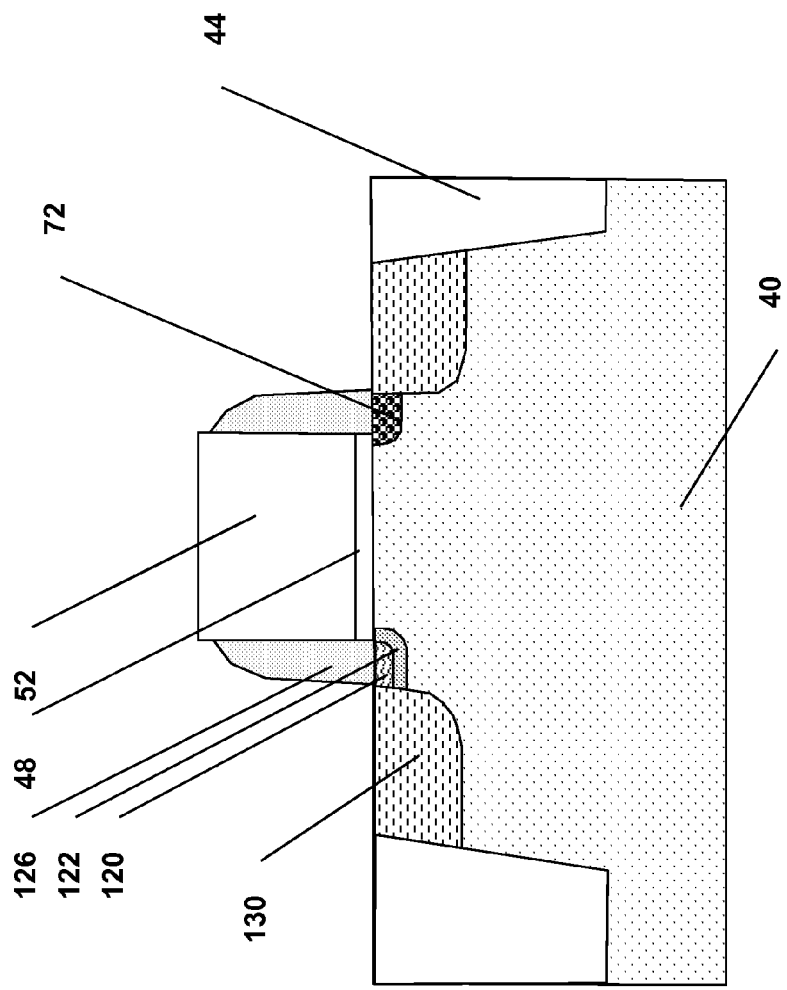
FIG. 2K shows a high performance asymmetric transistor according to an embodiment.

An embodiment high performance asymmetric cascade transistor is shown in FIG. 2K. A source extension diffusion 120 connects the asymmetric cascode transistor channel to the deep source diffusion 130 and the source pocket diffusion 122 helps set the turn on voltage, Vt, of the transistor at the source end of the transistor. The drain extension 72 is formed using a different extension implant than was used for the source extension 120. The drain extension 72 may or may not include a pocket implant. The embodiment asymmetric cascode transistor is built on a substrate 40 and includes a gate dielectric 48, a transistor gate 52, and deep source and drain diffusions 130 which are self aligned to the transistor sidewalls 126. The embodiment high performance asymmetric cascode transistor is isolated from other transistors by shallow trench isolation (STI) dielectric 44.

Cascode transistors are frequently used in circuits such as the power amplifier shown in FIG. 1A. To withstand the high voltage 36, $V_{MID\text{-}peak}$, on the drain side of the cascode transistor 26, a high voltage cascoded transistor 26 with a high turn on voltage Vthv is typically used. In a typical power amplifier circuit the cascode transistor 26 is a high voltage transistor such as an input/output (I/O) transistor which severely limits high frequency performance of the power amplifier due to high series resistance. In embodiments shown below transistor 26 is a high performance asymmetric cascode transistor which significantly improves high frequency performance of the power amplifier.

By setting the Vthv of the high performance asymmetric transistor cascode transistor 26 with a pocket implant on the source side, the rest of the channel may remain lightly doped significantly reducing series resistance. Since the region of the transistor channel with high pocket implant doping is short, the Vthv may be set high without seriously impacting series resistance. The high Vthv lowers the off current of the high performance asymmetric transistor which improves the transistor stability over time and also improves transistor reliability by reducing off state hot electron effects. It also enables the gate length of the transistor to be reduced compared to a conventional high voltage transistor additionally reducing the series resistance. The extension on the drain side of the high performance asymmetric transistor (plus optional pocket implant) may be optimized independently of the extension on the source side to meet high voltage specifications. In an example embodiment, the high performance asymmetric transistor may be added without additional cost to a baseline CMOS process flow with two or more gate oxide thicknesses.

In an example embodiment power amplifier, $V_{DD}$ is about 2.7 volts and Vthv of high performance asymmetric transistor 26 is about 1.25 volts. $V_{GC}$ is 2.5 volts so that $V_{MID\text{-}peak}=V_{GC}-\text{Vthv}=2.5-1.25=1.25$ volts. $V_{GG}$ 22 on the core logic transistor 20 has DC offset of about 0.6 volts with an AC signal of about +/−0.6 volts. The common node voltage Vlow 24 swings from about ground to 1.25 volts, the voltage on the drain of the cascode transistor Vmid swings 5 volts peak-to-peak and the voltage at the output. Vout swings about 20 volts peak to peak. In this example embodiment, the core logic source and drain extension and pocket implants are implanted into the source side of the high performance asymmetric transistor 26. The core logic turn on voltage, Vtc, set by the pocket implant is 0.4 volts. This pocket implant combined with the thicker high voltage gate dielectric on the high performance asymmetric transistor sets Vthv at 1.25 volts. The gate length on the high performance asymmetric transistor is 0.18 um which is significantly less than the 0.4 um minimum gate length achievable with a conventional high voltage transistor. This enables the power amplifier with the high performance asymmetric transistor to operate at higher frequencies and with higher power than a power amplifier with a conventional high voltage transistor.

By forming the source extension and pocket on the high performance asymmetric transistor using the same source and drain extension and (optional) pocket implants as the core transistors and forming the drain extension and (optional) pocket on the high performance asymmetric transistor using the same source and drain extension and pocket implants as a higher voltage transistor that is also in the baseline flow, the high performance asymmetric transistor may be formed without additional manufacturing cost.

The major steps in a process flow that adds a high performance, asymmetrical high performance transistor to a baseline process flow with core (LV) transistors with a first gate oxide thickness, intermediate voltage (MV) transistors with a second gate oxide thickness, and high voltage (HV) CMOS transistors with a third gate oxide thickness without adding additional cost is illustrated in FIGS. 2A-2K.

A partially processed integrated circuit is shown in FIG. 2A. An nwell 42 for forming pmos LV 60, pmos MV 62, and pmos HV transistors 64 is formed in a p-type substrate 40. LV nmos transistors 56, MV nmos transistors 54, and HV nmos transistors 52, and high performance asymmetric nmos transistors 58 are formed in the p-type substrate 40. The HV transistors have the thickest gate dielectric, the MV transistors have an intermediate gate dielectric thickness, and the LV transistors have the thinnest transistor gate dielectric. Gates 52 are typically polysilicon.

In FIG. 2B an nmos HV transistor extension photo resist pattern 68 is formed and an n-type dopant 66 such as phosphorus or arsenic or a combination thereof is implanted to form the nmos HV transistor 52 source and drain extensions 70 and the high performance asymmetric nmos transistor 58 extension 72. An optional pocket implant may also be added using this photo resist pattern 68.

A pmos HV transistor extension photo resist pattern 74 is formed in FIG. 2C and a p-type dopant 76 such as boron or BF2 is implanted to form the pmos HV transistor extensions 78.

An MV nmos transistor extension photo resist pattern 80 is formed in FIG. 2D and an n-type dopant 82 such as arsenic or phosphorus is implanted to form the source and drain extensions 86 on the MV nmos transistor 54. A p-type dopant 84 such as boron may also be implanted at an angle to form pockets 88 on the source and drain extensions 86 of the MV transistor 56.

MV pmos source and drain extension photo resist pattern 90 is formed in FIG. 2E and a p-type dopant 92 such as boron or BF2 is implanted to form the source and drain extensions 96. An n-type dopant 94 such as phosphorus or arsenic may also be implanted at an angle to form pockets 98 under the MV pmos transistor source and drain extensions 96 and edges of the MV transistor gate 54. This pocket implant adds to the nwell doping to adjust the turn on voltage of the pmos MV transistors.

Core (LV) pmos source and drain extension photo resist pattern 100 is formed in FIG. 2 F and a p-type dopant 102 such as boron or BF2 is implanted to form the source and drain extensions 106. An n-type dopant 104 such as phosphorus or arsenic may also be implanted at an angle to form pockets 108 under the LV pmos transistor source and drain extensions 106. The optional pocket implant may add to the nwell doping to adjust the turn on voltage of the LV pmos transistors.

A core (LV) nmos transistor extension photo resist pattern 110 is formed in FIG. 2G and an n-type dopant 112 such as arsenic or phosphorus is implanted to form the source and drain extensions 116 on the LV nmos transistor 56 and also on the extension 120 on the source side of the high performance asymmetric nmos transistor 56. A p-type dopant 114 such as boron or BF2 may also be implanted at an angle to form pockets 118 on the source and drain extensions 86 of the LV transistor 54 and also the pocket 122 on the source extension 120 of the high performance asymmetric nmos transistor 56. The pocket implant helps set the turn on voltage Vtc of the LV transistors 54 and also the turn on voltage Vthv on the high performance asymmetric nmos transistor 56. In an example embodiment, the LV nmos vt is 0.4 volts and the high performance asymmetric nmos transistor vt is 1.25 volts. The difference in turn on voltage, Vtc and Vthv, is the result of the difference in gate dielectric thickness. In the example embodiment the core gate dielectric thickness is about 1.5 nm and the high performance asymmetric transistor gate dielectric thickness is about 5.0 nm.

In FIG. 2H after the formation of sidewalls 126 on the transistors a nmos deep source and drain diffusion photo resist pattern 124 is formed and n-type dopant 128 such as phosphorus and arsenic or a combination thereof is implanted to form nmos deep source and drain diffusions 130 on the HV 52, MV 54, LV (core) 56, and high performance asymmetric 58 nmos transistor as well as contact 132 to the nwell. 42.

In FIG. 2I pmos deep source and drain diffusion photo resist pattern 134 and p-type dopant 136 such as boron and BF2 is implanted to form pmos deep source and drain diffusions 138 on the HV 64, MV 62, and LV (core) 60 pmos transistors and the contact 140 to the pwell 40.

The integrated circuit is shown in FIG. 2J, after silicide is formed on the diffusions 142 and also on top of the gates 144, a premetal dielectric (PMD) 148 is deposited, and contact plugs 146 are formed through the PMD 148 to form electrical contact to the transistors, the substrate 40 and the nwell 42. Further processing to form additional layers of interconnect and dielectric are performed to complete the integrated circuit.

An nmos high performance asymmetric transistor is used to illustrate the embodiment, but a pmos high performance asymmetric transistor may also be used. A process flow with three gate dielectric thicknesses is used to illustrate the embodiment, but any process with two or more gate dielectric thicknesses may be used.

In the embodiment process above the high performance asymmetric transistor is formed with MV gate dielectric, LV transistor source implant and HV transistor drain implant but any combination of gate dielectrics, source implants, and drain implants listed in Table 1 may be used for this embodiment.

TABLE 1

| Option | asymmetric transistor options | | |
|---|---|---|---|
| | source LDD | gate dielectric | drain LDD |
| 1 | LV | HV | HV |
| 2 | MV | HV | HV |
| 3 | LV | HV | MV |
| 4 | LV | MV | HV |
| 5 | LV | MV | MV |
| 6 | MV | MV | HV |

For example, in option 1 the high performance asymmetric transistor may have HV nmos gate dielectric with the LV transistor LDD on the source and the HV transistor LDD on the drain. Option 4 in table 1 is used to in FIG. 1A through FIG. 1J to illustrate these embodiments.

The transistor portion of a typical embodiment high performance power amplifier 158 is shown in FIG. 3A. The gain transistor 56 is electrically isolated from the high performance asymmetric cascode transistor 58 by STI isolation 44. Contacts 146 and interconnect 154 short the drain 150 of the cascode transistor 56 to the source 152 of the high performance asymmetric cascode transistor 58 to form the common node 24 of the power amplifier shown in FIG. 1A. The capacitance associated with diodes 150 and 152 plus contacts 146 and interconnect 154 must be charged and discharged during operation of the power amplifier. At high frequencies this capacitance may severely degrade performance of the power amplifier. In the embodiment shown in FIG. 3B this parasitic capacitance is reduced by removing the STI isolation and forming one common diffusion 156 which forms the drain on the gain transistor 56 and also the source on the cascode transistor 58. This embodiment significantly reduces the parasitic capacitance by eliminating capacitance associated with the contacts 146 and the interconnect 154 and also by significantly reducing the diode capacitance. In addition to improved performance of the power amplifier at high frequencies, this embodiment also reduces cost by reducing the area of the power amplifier.

A balanced or symmetric power amplifier embodiment is illustrated in FIG. 4. The drains of the high performance asymmetric cascode transistors from 166 and 168 share a common diffusion 162. This diffusion 162 may be connected through an inductor to the power supply and through a matching network to a load. The matched cascode plus gain transistor pairs, 158 and 160, approximately doubles the current or quadruples the power output (Power=I²R, where I=current, and R=resistance) of the power amplifier.

As shown in FIG. 5 the width 172 of the gain transistors, 164 and 170, may be the same as the width of the high performance asymmetric cascode transistors, 166 and 168.

As shown in FIG. 6 the width 176 of the gain transistors 164 and 170, may be different than the width of the cascode transistors.

Figure 7:
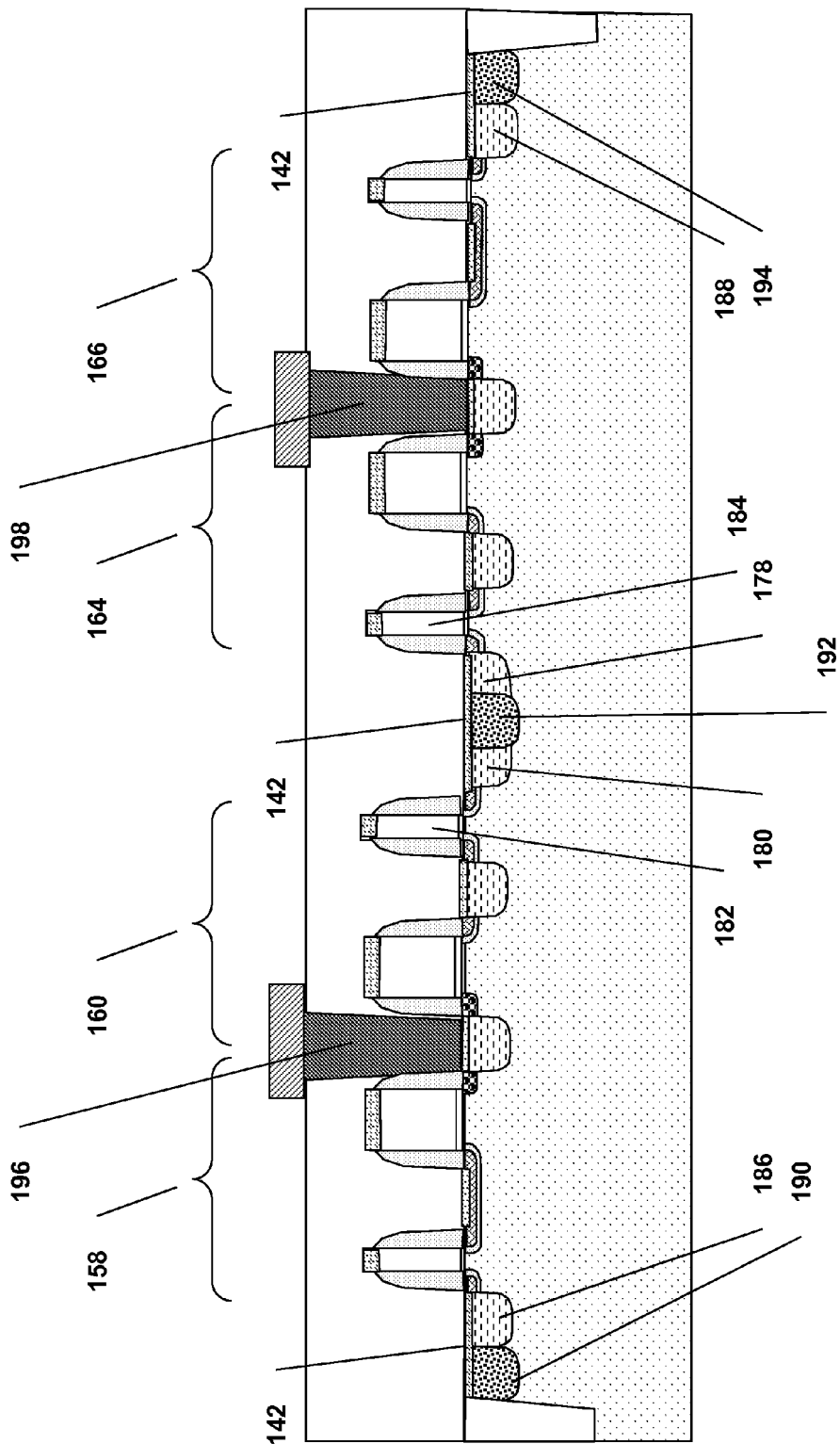
FIG. 7 shows an integrated circuit having multiple gain transistor plus high performance asymmetric cascade transistor circuits according to an embodiment.

More gain transistor plus high performance asymmetric cascode transistor power amplifier circuits 158, 160, 164, 166, may be ganged together as shown in the embodiment of FIG. 7 to additionally increase the power output capability of a high performance power amplifier. In FIG. 7 the sources 178 and 180 of the gain transistors 182 and 184 share a common diffusion. In this embodiment, substrate contact diffusions 190, 192, and 194 additionally are added to short the sources of the gain transistors to the p-well which is grounded. Silicide 142 electrically shorts the diode that would otherwise form between the n-type sources 178, 180, 186, and 188 to the p-type substrate contact diffusions 190, 192, and 192. This method of shorting the gain transistor sources to the grounded pwell, eliminates the need to form contacts and to provide interconnect routing to ground. This additionally improves performance by reducing parasitic capacitance and by eliminating the voltage drop across interconnect and contacts between the source of the gain transistor and ground.

In the above embodiments, the gain transistor is a LV transistor, but the gain transistor may also formed using other combinations of LDD implants and gate dielectrics such as those listed in TABLE 2.

TABLE 2

| option | gain transistor gate dielectric | LDDs |
|---|---|---|
| 1 | LV | LV |
| 2 | LV | MV |
| 3 | MV | LV |
| 4 | MV | MV |

In some applications it may be desirable to additionally improve the performance of the high performance power amplifier by providing a gain transistor with increased drive current. One method of increasing drive current of a gain transistor is to lower the turn on voltage (Vth) of the gain transistor. Typically, providing a transistor with a lower Vth requires the addition of a photo resist patterning and implantation step which increases cost.

It is common in deep submicron integrated circuit manufacturing flows to orient the gates of all core (LV) transistors in the same direction to reduce transistor-to-transistor variation and to improve transistor matching. In these flows the angled pocket implants are typically implanted with 2 rotations. A first angled pocket implant 204 is performed as shown in FIG. 8B to form the pocket 208 on the source extension which adjusts the substrate doping at the edge of the gate 200 and raises the transistor turn on voltage (Vth). The wafer is then rotated 180 degrees and a second angled pocket implant 206 is performed to form a pocket 10on the drain extension of the transistor gate 200.

As shown in FIGS. 9A and 9B a gain transistor with improved drive current may be formed by rotating the direction of the gate 212 of the gain transistor 90 degrees with respect to the orientation of the core (LV) transistors 200. The angled pocket implant with this gain transistor gate orientation is implanted parallel rather than perpendicular to the gate. Since the pocket is implanted parallel to the gate orientation, the pocket implant 214 does not go under the edge of the gate 212 and does not increase the doping concentration a the edge of the gate. The Vth of the gain transistor with this perpendicular orientation is not raised by the pocket implant. The lower vt on this transistor increases the drive current and therefore increases the performance of the high performance power amplifier.

This embodiment is illustrated with a gain transistor but the drive current of either the gain transistor or the high performance asymmetric cascode transistor may be increased by rotating the transistor by 90 degrees to block the pocket implant from changing the Vth or Vthv. In addition the orientation of both the gain and the cascode transistor may be rotated by 90 degrees if desired.

Those skilled in the art to which this invention relates will appreciate that the above embodiments also may be applied to CMOS process flows with oxide or nitride oxide dielectrics and polysilicon or metal gates and may be applied to CMOS process flows with high-k dielectrics and with metal gates.

Those skilled in the art to which this invention relates will appreciate that many other embodiments and variations are possible within the scope of the claimed invention.

What is claimed is:

1. An integrated circuit, comprising:
   a LV cmos transistor with a first dielectric thickness;
   a MV cmos transistor with a second dielectric thickness;
   a HV cmos transistor with a third dielectric thickness;
   a gain transistor with a dielectric thickness equal to said first dielectric thickness or equal to said second dielectric thickness;
   a high performance asymmetric cascode transistor further comprising:
      a dielectric thickness equal to said second dielectric thickness or equal to said third dielectric thickness;
      a source extension and a source pocket; and
      a drain extension where said drain extension is different than said source extension; and
   a source of said asymmetric cascode transistor coupled to a drain of said gain transistor.

2. The integrated circuit of claim 1 where said high performance asymmetric cascode transistor further comprises:
   a gate dielectric that is the same as said MV cmos transistor;
   said source extension and said source pocket is the same as a source extension and a source pocket on said LV cmos transistor; and
   said drain extension is the same as a drain extension on said HV cmos transistor.

3. The integrated circuit of claim 1 where said high performance asymmetric cascode transistor further comprises:
   a gate dielectric that is the same as said MV cmos transistor;
   said source extension and said source pocket is the same as a source extension and a source pocket on said MV cmos transistor; and
   said drain extension is the same as a drain extension on said HV cmos transistor.

4. The integrated circuit of claim 1 where said high performance asymmetric cascode transistor further comprises:
   a gate dielectric that is the same as said MV cmos transistor;
   said source extension and said source pocket is the same as a source extension and a source pocket on said LV cmos transistor; and
   said drain extension is the same as a drain extension on said MV cmos transistor.

5. The integrated circuit of claim 1 where said high performance asymmetric cascode transistor further comprises:
   a gate dielectric that is the same as said HV cmos transistor;
   said source extension and said source pocket is the same as a source extension and a source pocket on said LV cmos transistor; and
   said drain extension is the same as a drain extension on said HV cmos transistor.

6. The integrated circuit of claim 1 where said high performance asymmetric cascode transistor further comprises:
   a gate dielectric that is the same as said HV cmos transistor;
   said source extension and said source pocket is the same as a source extension and a source pocket on said MV cmos transistor; and
   said drain extension is the same as a drain extension on said HV cmos transistor.

7. The integrated circuit of claim 1 where said high performance asymmetric cascode transistor further comprises:
   a gate dielectric that is the same as said HV cmos transistor;
   said source extension and said source pocket is the same as a source extension and a source pocket on said LV cmos transistor; and
   said drain extension is the same as a drain extension on said MV cmos transistor.

8. The integrated circuit of claim 1 where said gain transistor further comprises:
   a gate dielectric that is the same as said LV cmos transistor; and
   source and drain extensions that are the same as said LV cmos transistor.

9. The integrated circuit of claim 1 where said gain transistor further comprises:
   a gate dielectric that is the same as said MV cmos transistor; and
   source and drain extensions that are the same as said MV cmos transistor.

10. The integrated circuit of claim 1 where said gain transistor further comprises:
    a gate dielectric that is the same as said MV cmos transistor; and
    source and drain extensions that are the same as said LV cmos transistor.

11. The integrated circuit of claim 1 where said gain transistor further comprises:
    a gate dielectric that is the same as said LV cmos transistor; and
    source and drain extensions that are the same as said MV cmos transistor.

12. The integrated circuit of claim 1 where extensions on said gain transistor are the same as extensions on said LV cmos transistor and where an orientation of a gate of said gain transistor is perpendicular to an orientation of said LV cmos transistor.

13. The integrated circuit of claim 1 where extensions on said gain transistor are the same as extensions on said MV cmos transistor and where an orientation of a gate of said gain transistor is perpendicular to an orientation of said MV cmos transistor.

14. The integrated circuit of claim 1 where a source extension on said high performance analog cascode transistor is the same as extensions on said LV cmos transistor and where an orientation of a gate of said high performance analog cascode transistor is perpendicular to an orientation of said LV cmos transistor.

15. The integrated circuit of claim 1 where a source extension on said high performance analog cascode transistor is the same as extensions on said MV cmos transistor and where an orientation of a gate of said high performance asymmetric cascode transistor is perpendicular to an orientation of said MV cmos transistor.

16. The integrated circuit of claim 1 where said source of said high performance asymmetric cascode transistor is electrically separated from said drain of said gain transistor by STI isolation and where said source of said high performance asymmetric cascode transistor is coupled to said drain of said gain transistor through contacts and interconnect.

17. The integrated circuit of claim 1 where a source diffusion of said source of said high performance asymmetric cascode transistor and a drain diffusion of said drain of said gain transistor are the same diffusion.

18. The integrated circuit of claim 1 where a source diffusion of said gain transistor is shorted to a substrate contact.

19. The integrated circuit of claim 1 where a drain of said high performance asymmetric cascode transistor is coupled to an inductor and coupled to a matching circuit.

20. The integrated circuit of claim 1 where said LV transistor, said MV transistor, said HV transistor, said gain transistor, and said high performance asymmetric cascode transistor are nmos transistors.

21. The integrated circuit of claim 1 where said LV transistor, said MV transistor, said HV transistor, said gain transistor, and said high performance asymmetric cascode transistor are pmos transistors.

22. The integrated circuit of claim 1 where said first dielectric thickness is the same as said second dielectric thickness and where said LV transistor and said MV transistor are identical transistors.

23. The integrated circuit of claim 1 where said second dielectric thickness is the same as said third dielectric thickness and where said MV transistor and said HV transistor are identical transistors.

24. A process of forming an integrated circuit, comprising the steps:
  forming a first gate dielectric with a first dielectric thickness;
  forming a second gate dielectric with a second dielectric thickness;
  forming a gate of a gain transistor on said first gate dielectric and forming a gate of a high performance asymmetric cascode transistor on said second gate dielectric;
  implanting a source and drain gain extension dopant and a gain pocket dopant self aligned to said gate of said gain transistor;
  implanting a source cascode extension dopant and a source cascode pocket dopant self aligned to a first side of said gate of said high performance asymmetric cascode transistor;
  implanting a drain cascode extension dopant self aligned to a second side of said gate of said high performance asymmetric cascode transistor where a concentration of said source cascode extension dopant is different than a concentration of said drain cascode extension dopant; and
  coupling a source of said high performance asymmetric cascode transistor to a drain of said gain transistor to form a portion of a high performance power amplifier circuit.

25. The process of claim 24, where said step of implanting a source cascode extension dopant is performed at the same time as said step of implanting said source and drain gain extension dopant and where a concentration of said source and drain gain extension dopant is equal to a concentration of said source cascode extension dopant and where a concentration of said gain pocket dopant is equal to a concentration of a cascode pocket dopant and where said step of implanting a source cascode pocket dopant is performed at the same time as said step of implanting said gain pocket dopant and where a concentration of said gain pocket dopant is equal to a concentration of said source cascode pocket dopant.

26. The process of claim 24 where said gain transistor is a core transistor in said integrated circuit, where said second dielectric is a dielectric equal to a dielectric on an I/O transistor in said integrated circuit, and where said drain cascode extension dopant is equal to a source and drain extension dopant on said I/O transistor.

27. The process of claim 24 where a drain of said gain transistor is separated from a source of said high performance asymmetric cascode transistor with STI and where said source is coupled to said drain through contacts and interconnect.

28. The process of claim 24 where said step of coupling further includes forming a drain of said gain transistor and a source of said high performance asymmetric cascode transistor in the same active geometry.

29. The process of claim 24 where an orientation of said gate of said gain transistor is perpendicular to a core transistor gate in said integrated circuit.

30. The process of claim 24 where said source cascode extension dopant and said cascode pocket dopant is a source and drain extension dopant and a pocket dopant on a core transistor in said integrated circuit and where an orientation of said gate of said high performance asymmetric cascode transistor is perpendicular to an orientation of a gate of said core transistor.

31. The process of claim 24 further comprising the steps;
  forming a low voltage dielectric, an intermediate voltage dielectric, and a high voltage dielectric;
  forming a core cmos transistor gate on said low voltage dielectric, an intermediate cmos transistor gate on said intermediate voltage dielectric, and an I/O transistor gate on said high voltage dielectric;
  implanting source and drain core extension dopants self aligned to said core cmos transistor gate and implanting core pocket dopants self aligned to said core cmos transistor gate;
  implanting source and drain intermediate extension dopants self aligned to said intermediate cmos transistor gate, and implanting intermediate pocket dopants self aligned to said intermediate cmos transistor gate;
  implanting source and drain I/O extension dopants self aligned to said I/O transistor gate;
  where said first dielectric is formed simultaneously with one of said low voltage dielectric or said intermediate voltage dielectric;
  where said step of implanting said source and drain gain extension dopants is performed simultaneously with one of said step of implanting said source and drain cmos extension dopant or said step of implanting said source and drain intermediate extension dopant;
  where said step of implanting said gain pocket dopants is performed simultaneously with one of said step of implanting said cmos pocket dopant or said step of implanting said intermediate pocket dopant;
  where said second dielectric is formed simultaneously with one of said intermediate voltage dielectric or said I/O dielectric;
  where said step of implanting said source cascode extension dopant is performed simultaneously with one of said step of implanting said source and drain cmos extension dopant or said step of implanting said source and drain intermediate extension dopant;
  where said step of implanting said source cascode pocket dopant is performed simultaneously with one of said step of implanting said source and drain cmos pocket dopant or said step of implanting said source and drain intermediate pocket dopant; and where said step of implanting said drain cascode extension dopant is performed simultaneously with one of said step of implanting said source and drain intermediate extension dopant or said step of implanting said source and drain I/O extension dopant.

\* \* \* \* \*